United States Patent
Kwan et al.

(10) Patent No.: US 7,766,211 B2
(45) Date of Patent: Aug. 3, 2010

(54) TEMPERATURE CONTROL OF A BONDING STAGE

(75) Inventors: Ka Shing Kenny Kwan, Singapore (SG); Gang Ou, Singapore (SG); Yong Wang, Singapore (SG); Man Chan, Singapore (SG)

(73) Assignee: ASM Technology Singapore Pte Ltd, Singapore (SG)

( * ) Notice: Subject to any disclaimer, the term of this patent is extended or adjusted under 35 U.S.C. 154(b) by 203 days.

(21) Appl. No.: 12/113,537

(22) Filed: May 1, 2008

(65) Prior Publication Data
US 2008/0271851 A1    Nov. 6, 2008

Related U.S. Application Data

(60) Provisional application No. 60/916,022, filed on May 4, 2007.

(51) Int. Cl.
*B23K 37/00* (2006.01)
(52) U.S. Cl. ............... 228/4.5; 228/9; 228/46
(58) Field of Classification Search ............... None
See application file for complete search history.

(56) References Cited

U.S. PATENT DOCUMENTS

| | | | | |
|---|---|---|---|---|
| 3,342,396 A | * | 9/1967 | Miller | 228/4.5 |
| 6,302,317 B1 | * | 10/2001 | Narita et al. | 228/254 |
| 6,357,649 B1 | * | 3/2002 | Okatsu et al. | 228/179.1 |
| 6,527,027 B2 | * | 3/2003 | Sugiura et al. | 156/389 |
| 6,578,753 B1 | * | 6/2003 | Sakakura | 228/110.1 |
| 7,103,959 B2 | * | 9/2006 | Yeap et al. | 29/564 |
| 7,614,540 B2 | * | 11/2009 | Kwan et al. | 228/180.5 |
| 7,644,852 B2 | * | 1/2010 | Nishiura et al. | 228/9 |
| 2002/0027152 A1 | * | 3/2002 | Ushiki et al. | 228/4.5 |

FOREIGN PATENT DOCUMENTS

| | | | |
|---|---|---|---|
| JP | 57-211241 A | * | 12/1982 |
| JP | 61-198737 A | * | 9/1986 |
| JP | 62-162338 A | * | 7/1987 |
| JP | 2-276258 A | * | 11/1990 |

* cited by examiner

*Primary Examiner*—Kiley Stoner
(74) *Attorney, Agent, or Firm*—Ostrolenk Faber LLP

(57) ABSTRACT

A bonding apparatus is provided comprising a bonding stage for holding a bonding tool, an air distribution system mounted to the bonding stage and an air inlet attached to the air distribution system. The air distribution system is connected to the air inlet for receiving air from the air inlet, and is operative to pass the air over multiple surfaces of the bonding stage for the purpose of temperature control.

19 Claims, 5 Drawing Sheets

TEMPERATURE CONTROL OF A BONDING STAGE

CROSS REFERENCE TO RELATED APPLICATION

This application claims the benefit and priority of U.S. Provisional Application Ser. No. 60/916,022 filed May 4, 2007, and entitled TEMPERATURE CONTROL OF A BONDING STAGE, the disclosure of which is incorporated herein by reference.

FIELD OF THE INVENTION

The invention relates to a bonding stage, such as a bonding stage of a wire bonder, and in particular to controlling the temperature of the bonding stage in order to reduce the adverse effects of external heat sources.

BACKGROUND AND PRIOR ART

Wire bonding is a process in which semiconductor chips are wired after they are mounted onto a substrate, typically a leadframe, to electrically connect the semiconductor chips and the substrate. The wire bonder has a capillary that is clamped to the tip of an ultrasonic transducer, which serves to secure bonding wire to a connection point on the semiconductor chip and to a corresponding connection point on the leadframe. To form the wire connection between the connection points, an end of the bonding wire protruding out of the capillary is first melted into a ball. Thereafter, the melted ball is secured to the connection point on the semiconductor chip by means of pressure and ultrasonic energy in a process called ball bonding. The wire is then pulled through to the required length, formed into a wire loop and welded to the connection point on the leadframe in a process called wedge bonding. After securing the wire to the connection point on the leadframe, the wire is torn off and the bonding cycle is repeated.

FIG. 1(a) is a side view of a conventional wire bonding system 10 wherein a bonding stage 12 is located close to a wire bonding area. The bonding stage 12 supports an optics system 14 that is used for viewing the bonding area, and a camera 16 that is configured to receive images transmitted by the optics system 14.

The bonding stage 12 also holds a transducer 18 that has a capillary 19 clamped to its tip for performing wire bonding. A device 20 to be wire bonded at the bonding area using the capillary 19 is supported on a heater block 22 that is operative to bring the device 20 to a suitable wire bonding temperature. Heat 24 is generated by the heater block 22 and such heat 24 dissipates to the surrounding ambient air.

The heat 24 may be absorbed by the bonding stage 12, optics system 14 and the transducer 18 due to their proximity to the heater block 22. Thus, the heat 24 may cause the bonding stage 12, optics system 14 and transducer 18 to expand.

FIG. 1(b) is a side view of the conventional wire bonding system 10 wherein the bonding stage 12 is located further away from the wire bonding area because another location in the bonding area is being bonded. In this case, since the heater block 22 may no longer be directly underneath the components that were previously heated, the bonding stage 12, optics system 14 and transducer 18 may start to cool down and contract.

Therefore, it is observed that when the bonding stage 12 is moved close to the heater block 22, the temperature of the bonding stage 12 will be raised by the heat transferred from the heater block 22. Conversely, when the bonding stage 12 moves further away from the heater block 22, its temperature will be relatively lower. As a result, the temperature of the whole bonding stage 12 will be continually changed during bonding. The temperature change of the bonding stage will create unwanted deviations in the position of both the optics system 14 and the transducer 18 by thermal expansion and contraction. This leads to inaccuracy of bonding on the semiconductor chip as well as on the leadframe. As far as possible, the temperature of the bonding stage should desirably be kept constant during bonding.

A traditional approach to temperature control is to couple a heater to the bonding stage. The heater may be used to raise the temperature of the bonding stage 12 by heating it, and to lower the temperature of the bonding stage 12, the bonding stage 12 may be air-cooled naturally with ambient air by deactivating the heater. A problem with this approach is that the rate of heating and cooling are different since only heating is actively conducted. Cooling will generally take a longer time. Another problem is that heating and cooling is localized at the position of the heater, which builds up a thermal gradient that leads to thermal stress. It would be preferable to be able to both heat and cool the whole of the bonding stage dynamically.

SUMMARY OF THE INVENTION

It is thus an object of the invention to seek to maintain greater consistency in the temperature of a bonding stage during bonding operations as compared to the aforesaid prior art.

Accordingly, the invention provides a bonding apparatus comprising: a bonding stage for holding a bonding tool; an air distribution system mounted to the bonding stage; and an air inlet attached to the air distribution system; wherein the air distribution system is connected to the air inlet for receiving air from the air inlet, and the air distribution system is operative to pass the air over multiple surfaces of the bonding stage.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of preferred embodiments of the invention when considered with the accompanying drawings, in which.

DETAILED DESCRIPTION OF THE PREFERRED EMBODIMENTS OF THE INVENTION

Figure 1A:
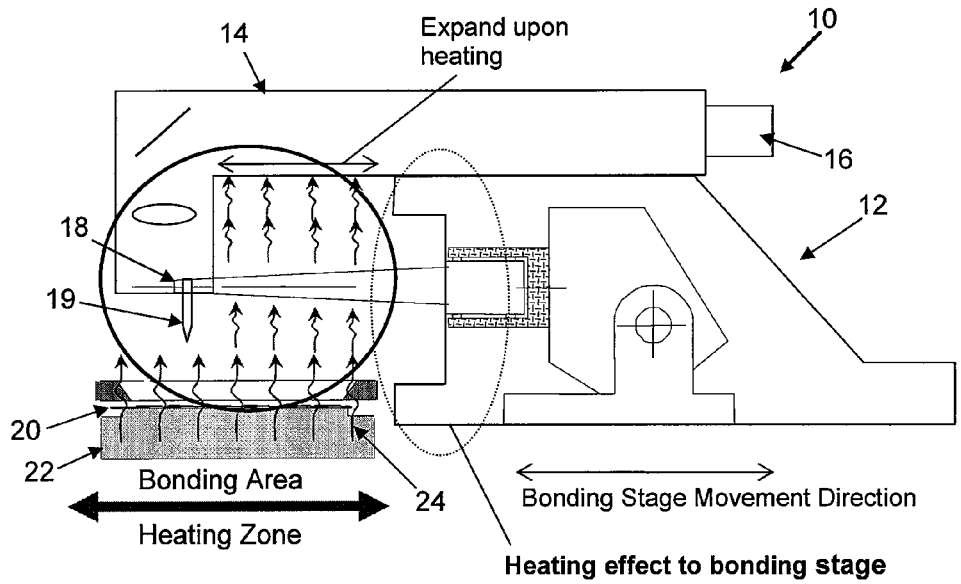
FIGS. 1(a) and 1(b) are side views of a conventional bonding system wherein a bonding stage is shown at different positions relative to a bonding area.
Figure 1B:
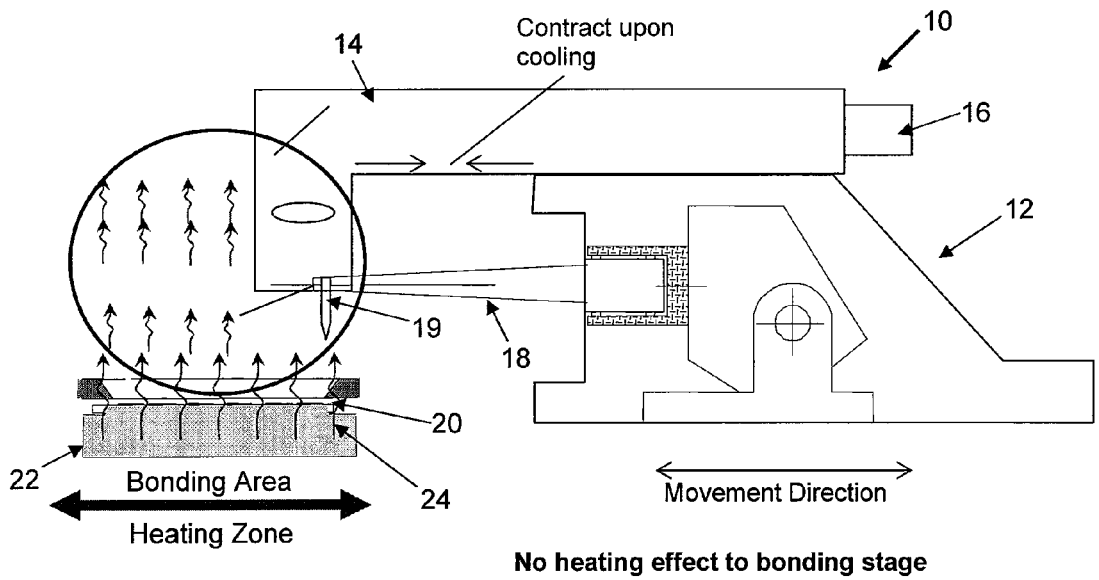
Figure 2:
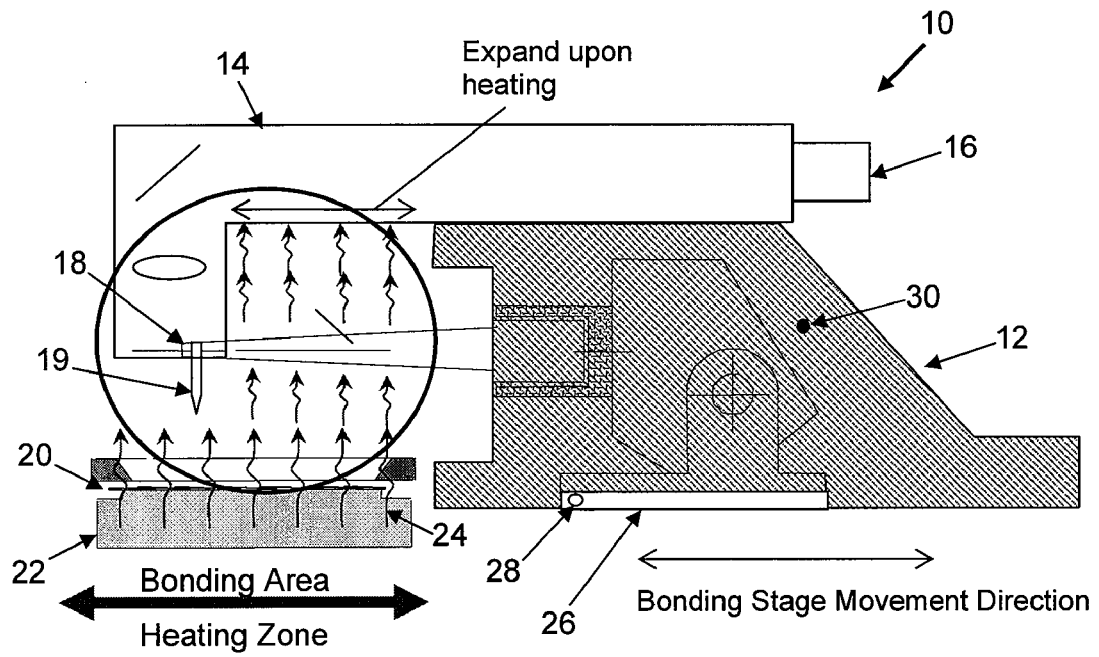
FIG. 2 is a side view of a temperature-controlled bonding stage of a bonding apparatus according to the first preferred embodiment of the invention.

FIG. 2 is a side view of a temperature-controlled bonding stage 12 of a bonding apparatus 10, such as a wire bonder, according to the first preferred embodiment of the invention. The bonding stage 12 holds a bonding tool comprising a transducer 18 that has a capillary 19 clamped to its tip for performing wire bonding. An air distribution system, which may comprise an air distribution plate in the form of a base plate 26, is incorporated on the bonding stage 12, preferably at the bottom of the bonding stage 12. It has an opening to which an air inlet 28 is connected to introduce air, preferably compressed air, into the base plate 26 which is them operative to pass the air over multiple internal surfaces of the bonding stage 12. A temperature sensor, such as a thermocouple 30, is attached to the bonding stage 12 to monitor a temperature of the bonding stage 12 at any one time.

Figure 3:
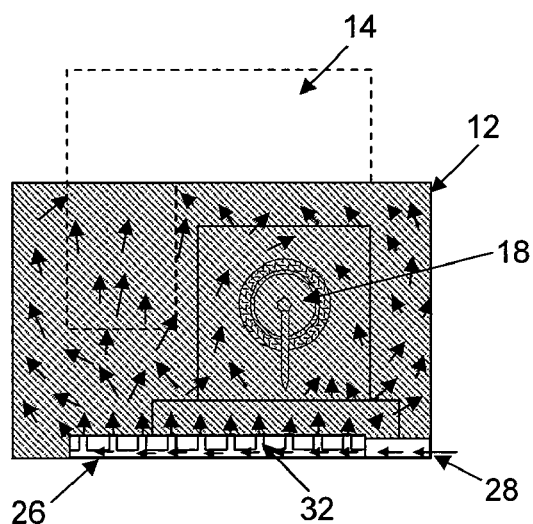
FIG. 3 is a front view of the bonding apparatus of FIG. 2.

FIG. 3 is a front view of the bonding apparatus 10 of FIG. 2. This view shows multiple air nozzles 32 in the base plate 26 which are operative to dispense and distribute the temperature-controlling air to the internal surfaces of the bonding stage 12 by passing the air over multiple surfaces of the bonding stage 12. The air nozzles 32 are arranged such that the dispensed air is dispersed uniformly into the bonding stage 12 without any thermal stress inside the stage, resulting in reduced mechanical stress.

Figure 4A:
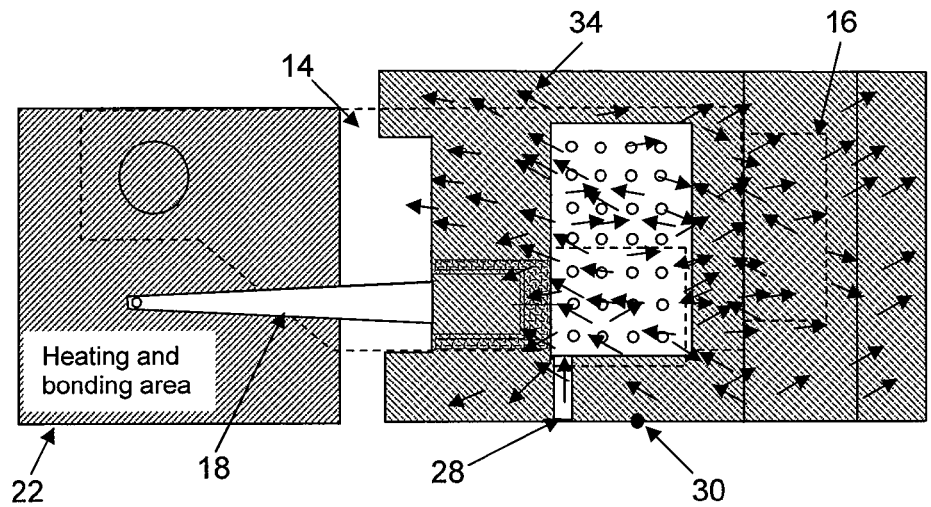
FIGS. 4(a) and 4(b) are plan views of the bonding apparatus of FIG. 2 wherein the bonding stage is shown at different positions relative to the bonding area.

FIG. 4(a) is a plan view of the bonding apparatus of FIG. 2 wherein the bonding stage 12 is located close to the bonding area. The air flow 34 is distributed in the structure of the bonding stage 12 underneath the optics system 14. Since the bonding stage 12 receives more heat from a heating source, such as a heating block 22, at this position, cooling air which may be in the form of cold air may be injected to the components of the bonding stage 12 through the air inlet 28 in order to lower the temperature of the bonding stage 12.

Figure 4B:
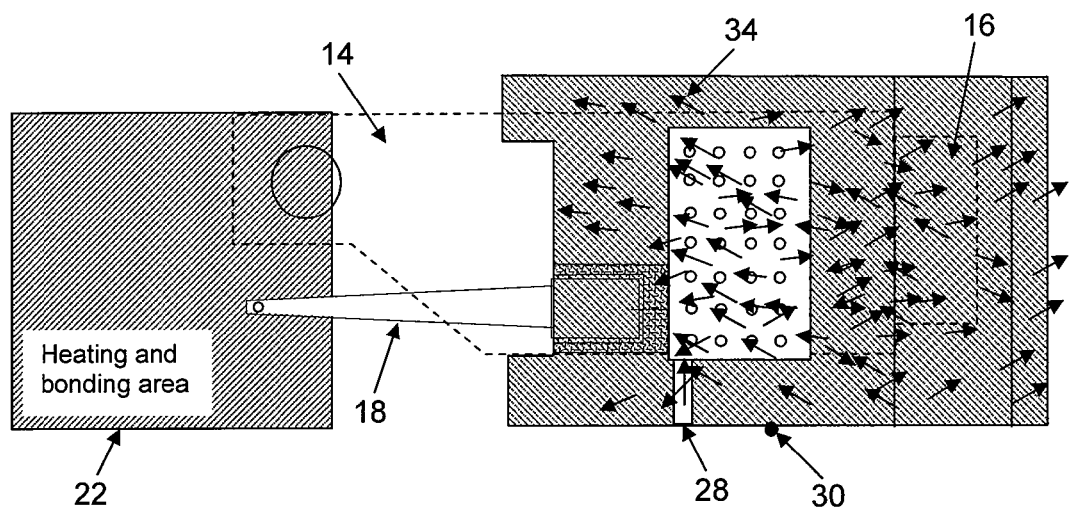

FIG. 4(b) is a plan view of the bonding apparatus of FIG. 2 wherein the bonding stage 12 is located further away from the bonding area and the heating block 22. The air flow 34 is distributed as for FIG. 4(a). However, since the temperature of the bonding stage 12 may be relatively cooler at this position, heating air which may be in the form of hot air may be injected to the components of the bonding stage 12 through the air inlet 28 in order to keep the temperature of the bonding stage 12 relatively constant. For this purpose, the thermocouple 30 is preferably operative to determine whether cooling air or heating air (and the exact portions thereof) is required by monitoring the temperature of the bonding stage 12. In this way, the air inlet 28 is operative to inject either hot or cold air to the base plate 26 depending on the position of the bonding stage 12 relative to the heating block 22.

Figure 5:
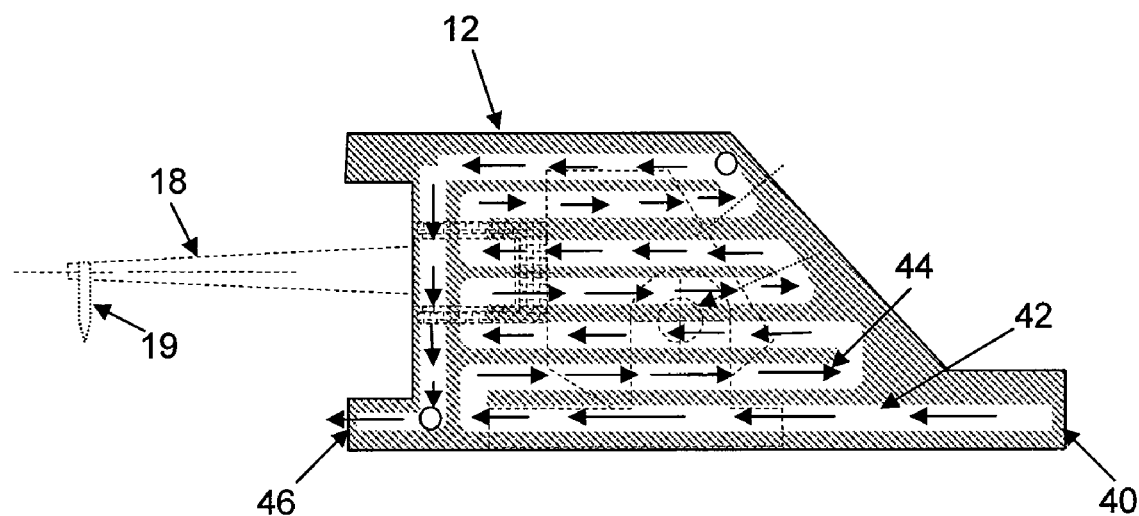
FIG. 5 is a side view of a bonding stage according to the second preferred embodiment of the invention including a vertically guided air circulation path.

FIG. 5 is a side view of a bonding stage 12 according to the second preferred embodiment of the invention including a vertically guided air circulation path 42 found on at least one wall of the bonding stage 12. In this embodiment, an air inlet 40 introduces air into the vertically guided air circulation path 42 that is formed on the walls of the bonding stage 12. This air circulation path 42 may be formed by fabricating the side walls with air channels, or by mounting tubing along the side walls for carrying the air in the tubing.

An air flow 44 is guided by the air circulation path 42 to cover as much of the surface of the bonding stage 12 as practicable to improve temperature control. Preferably, the air circulation path 32 is configured to extend over a majority of the at least one wall of the bonding stage 12. Thereafter, the air flow 44 exits from the bonding stage through an air outlet 46. This method can minimize the amount of air used and has the benefit of greater heat-transfer efficiency to remove heat from or to heat up the bonding stage 12. Most preferably, the guided air circulation paths substantially surround the whole bonding stage 12.

Figure 6:
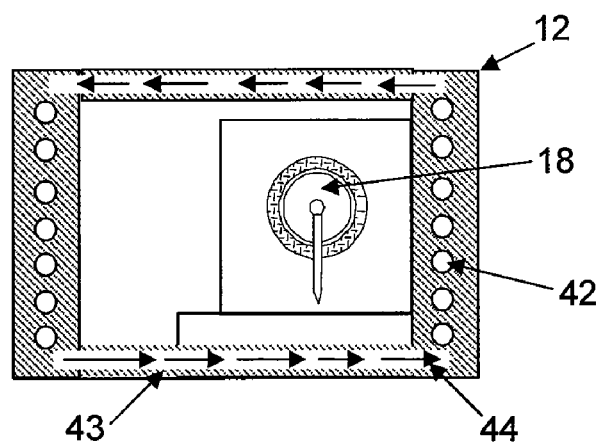
FIG. 6 is a front view of the bonding stage of FIG. 5.

FIG. 6 is a front view of the bonding stage 12 of FIG. 5. It shows a horizontally guided air circulation path 43 linking vertically guided air circulation paths 42 located on opposite side walls of the bonding stage 12. This set-up allows one air inlet 40 and one air outlet 46 to be used for controlling the temperature of the whole bonding stage 12, since the air inlet 40, air circulation paths 42 and air outlet to be all fluidly connected, although they may be located on different walls.

Figure 7:
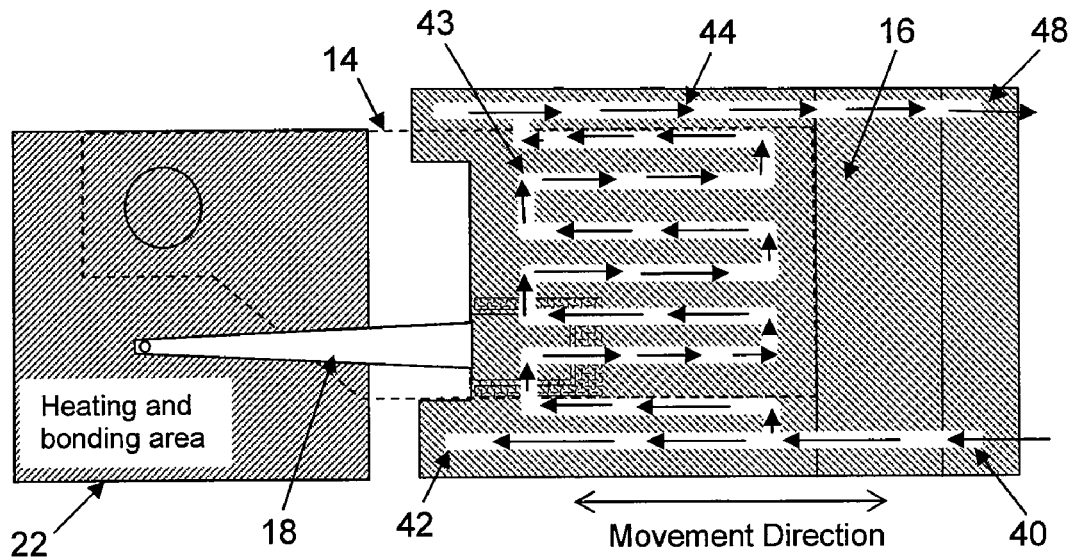
FIG. 7 is a plan view of the bonding stage of FIG. 5 illustrating a horizontally guided cooling air circulation path.

FIG. 7 is a plan view of the bonding stage of FIG. 5 illustrating the horizontally guided air circulation path 43. From the vertically guided air circulation path 42, the air flow 44 passes through the network of horizontally-arranged air paths to arrive at a vertically guided air circulation path 42 on an opposite side of the bonding stage 12. In this setup, the air inlet 40 is on one side of the bonding stage 12 and the air outlet 48 is on an opposite side of the bonding stage 12. Air is introduced into the respective guided air circulation paths 42, 43 throughout the range of movement of the bonding stage 12.

Figure 8:
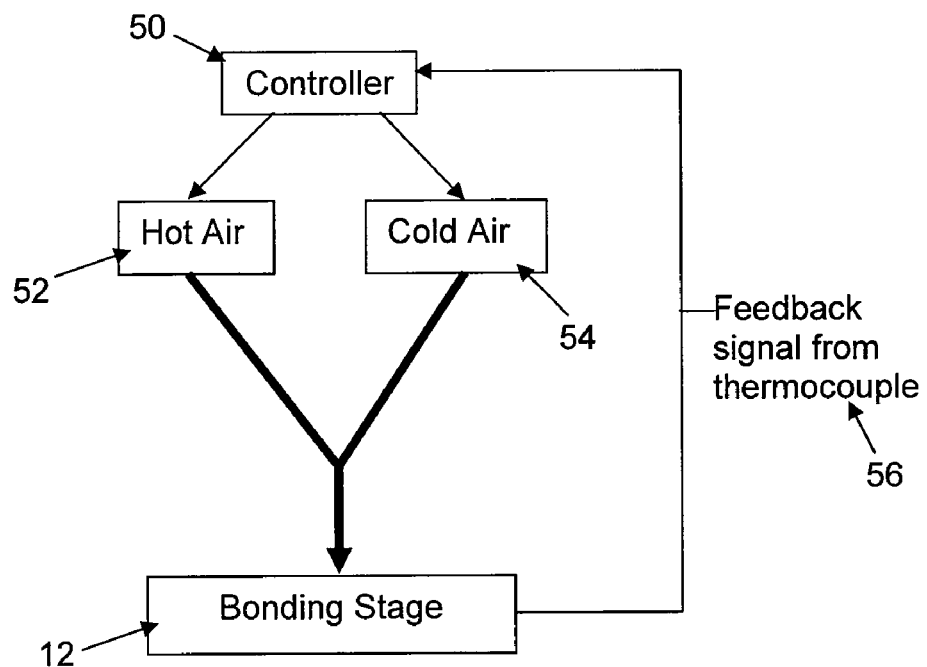
FIG. 8 is a schematic diagram showing temperature control of a bonding stage using both hot and cold compressed air.

FIG. 8 is a schematic diagram showing temperature control of a bonding stage using both hot and cold compressed air. The thermocouple 30 incorporated in the bonding stage 12 continuously measures the temperature of the bonding stage 12, and feedback signals 56 are sent from the thermocouple 30 to a controller 50 which is linked to the thermocouple 30. The supply of hot air 52 and cold air 54 is preferably channeled through a T-type air line. Depending on whether the bonding stage 12 needs to be heated up or cooled down, the controller 50 controls the amount of hot air 52 or cold air 54 to be fed to the bonding stage 12 through the T-type air inlet based upon a feedback signal received from the thermocouple 30. In this way, closed-loop control of the temperature of the bonding stage can be achieved.

It should be appreciated that using air for the purpose of temperature control has the advantage of providing a more uniform temperature distribution inside the bonding stage 12. Since thermal stress is reduced inside the bonding stage 12, there is minimal mechanical change of shape of the bonding stage 12 that is introduced by thermal stress. Moreover, the air inlet position 28 may be flexibly selected from more locations according to the design of the bonding stage 12.

Unlike localized heating with a heater as used in the prior art, both heating and cooling of the bonding system according to the preferred embodiments of the invention are dynamically controlled. In this way, the speed of heating and cooling can be controlled more precisely. Further, as the temperature-controlling air is distributed over multiple surfaces of the bonding stage to substantially the whole of the bonding stage, there is no noticeable thermal gradient built up in the bonding stage and thermal stress on the bonding stage is minimized. Ultimately, since the temperature change of the bonding stage 12 during bonding is reduced, the components which are mounted on the bonding stage also have greater thermal stability. Consequently, improved bonding accuracy can be achieved.

The invention described herein is susceptible to variations, modifications and/or additions other than those specifically described and it is to be understood that the invention includes all such variations, modifications and/or additions which fall within the spirit and scope of the above description.

The invention claimed is:

1. A bonding apparatus comprising:
   a bonding stage for holding a bonding tool, the bonding stage including a plurality of internal surfaces;
   an air distribution system mounted to the bonding stage, the air distribution system including air nozzles configured and operable to dispense and distribute air to the internal surfaces of the bonding stage; and
   an air inlet attached to the air distribution system, the air distribution system being connected to the air inlet for receiving air from the air inlet.

2. The bonding apparatus as claimed in claim 1, wherein the air distribution system comprises an air distribution plate located on the bonding stage, the air distribution plate having an opening to which the air inlet is connected.

3. The bonding apparatus as claimed in claim 1, wherein the air nozzles are arranged such that the air is dispersed uniformly onto the internal surfaces of the bonding stage.

4. The bonding apparatus as claimed in claim 1, wherein the air comprises both hot and cold compressed air.

5. The bonding apparatus as claimed in claim 4, wherein the air inlet is operative to inject hot or cold compressed air to the air distribution system depending on a position of the bonding stage relative to a heat source.

6. The bonding apparatus as claimed in claim 1, wherein the air distribution system comprises an air circulation path formed on at least one wall of the bonding stage.

7. The bonding apparatus as claimed in claim 6, wherein the at least one wall of the bonding stage includes air channels forming the air circulation path.

8. The bonding apparatus as claimed in claim 6, further comprising a tubing operable to carry the air and mounted along the at least one wall of the bonding stage, the tubing forming the air circulation path.

9. The bonding apparatus as claimed in claim 6, wherein the air circulation path is configured to extend over a majority of a wall of the bonding stage.

10. The bonding apparatus as claimed in claim 6, further comprising air circulation paths formed over multiple walls of the bonding stage.

11. The bonding apparatus as claimed in claim 10, wherein the air circulation paths formed on different walls of the bonding stage are fluidly connected.

12. The bonding apparatus as claimed in claim 11, wherein the air inlet is attached to one wall of the bonding stage and is fluidly connected with an air outlet attached to a different wall of the bonding stage.

13. The bonding apparatus as claimed in claim 6, wherein the air circulation path substantially surrounds the whole bonding stage.

14. The bonding apparatus as claimed in claim 1, further comprising a temperature sensor attached to the bonding stage for monitoring a temperature of the bonding stage.

15. The bonding apparatus as claimed in claim 14, further comprising a controller linked to the temperature sensor, the controller being operable to control an amount of hot or cold air to be fed to the bonding stage based upon a feedback signal received from the temperature sensor.

16. The bonding apparatus as claimed in claim 1, wherein the nozzles of the air distribution system are operative to introduce air to the bonding stage throughout a range of movement of the bonding stage.

17. The bonding apparatus as claimed in claim 1, wherein the bonding apparatus comprises a wire bonder.

18. The bonding apparatus as claimed in claim 17, wherein the bonding tool comprises a transducer having a capillary clamped to its tip.

19. A bonding apparatus comprising:
   a bonding stage operable to hold a bonding tool, the bonding stage including a plurality of surfaces and at least one wall with a plurality of air channels formed thereon;
   an air distribution system mounted to the bonding stage, the air distribution system including an air circulation path formed by the air channels of the at least one wall; and
   an air inlet attached to the air distribution system, the air distribution system being connected to the air inlet for receiving air from the air inlet, and the air distribution system being configured and operable to pass the air over the surfaces of the bonding stage.

* * * * *